United States Patent [19]

Paparo et al.

[11] Patent Number: 5,245,211
[45] Date of Patent: Sep. 14, 1993

[54] DEVICE FOR THE PROTECTION AGAINST BREAKDOWN OF AN N+ TYPE DIFFUSED REGION INSERTED IN VERTICAL-TYPE SEMICONDUCTOR INTEGRATED POWER STRUCTURE

[75] Inventors: Mario Paparo, San Giovanni la Punta; Sergio Palara, Acicastello, both of Italy

[73] Assignee: SGS-Thomson Microelectronics s.r.l., Milan, Italy

[21] Appl. No.: 605,448

[22] Filed: Oct. 30, 1990

[30] Foreign Application Priority Data

Nov. 7, 1989 [IT] Italy .................. 22289 A/89

[51] Int. Cl.$^5$ ............................. H01L 27/06
[52] U.S. Cl. .................. 257/502; 257/337; 257/528; 257/776
[58] Field of Search ............ 357/48, 51, 86; 257/337, 502, 776, 528

[56] References Cited

U.S. PATENT DOCUMENTS

| | | | |
|---|---|---|---|
| 3,999,215 | 12/1976 | Aagaard | 357/48 |
| 4,521,799 | 6/1985 | Davies | 357/51 |
| 4,903,093 | 2/1990 | Ide et al. | 357/51 |
| 4,947,231 | 8/1990 | Palara et al. | 357/48 |
| 4,969,030 | 11/1990 | Musumori et al. | 357/48 |

FOREIGN PATENT DOCUMENTS 57-18354  1/1982  Japan .

OTHER PUBLICATIONS

Hershman, IBM Tech Discl Bulletin, vol. 14, No. 4, Sep. 1971, p. 1207.
IBM Technical Disclosure Bulletin, vol. 19 No. 7 Dec. 1976, pp. 2598–2599 "N+ Multiple Underpass Device"; C. A. Price and J. W. Wolf.

Primary Examiner—William D. Larkins
Attorney, Agent, or Firm—Griffin Butler Whisenhunt & Kurtossy

[57] ABSTRACT

A device accomplishes protection against breakdown of an N+ type diffused region (6) inserted in a vertical-type semiconductor integrated power structure. Such a structure comprises N+ type substrate (1) over which there is superimposed an N− type epitaxial layer (2) in which a grounded P type insulation pocket (3) is obtained. The insulation pocket (3) contains an N type region (4) including a P type region (5) for the containment of the N+ type diffused region (6). The diffused region (6) is insulated electrically with respect to the P type containment region (5).

5 Claims, 2 Drawing Sheets

DEVICE FOR THE PROTECTION AGAINST BREAKDOWN OF AN N+ TYPE DIFFUSED REGION INSERTED IN VERTICAL-TYPE SEMICONDUCTOR INTEGRATED POWER STRUCTURE

BACKGROUND

I. Field of the Invention

The present invention relates to a device for the protection against breakdown of an N+ type diffused region inserted in a vertical-type semiconductor integrated power structure.

II. Prior Art and other Considerations

A semiconductor integrated structure comprises essentially an N+ type substrate over which there is superimposed an N− type epitaxial layer in which there are obtained P type insulation pockets, connected to ground, which in turn contain respective N type regions.

In a structure of this type the problem often arises of connecting two metal tracks avoiding the crossing with other metal tracks.

According to a first prior art solution technique such problem is solved by inserting N+ type regions inside the N type regions. Such regions behave like low-value resistances and have the function of connection underpasses (also known as crossunders) between the metal tracks.

Often, according to a second prior art solution technique, each of these N+ type connection regions is diffused over a P type region in turn accomplished inside an N type region and having the extremities shortcircuited with those of the N+ region.

If the first technique for solving the problem is used, inside the integrated structure there is the formation of a parasitic transistor whose base is accomplished at the P type insulation pocket, while the collector is accomplished in the N type region and connected to the N+ type region and the emitter is connected to the substrate.

If the second technique for solving the problem is used, inside the integrated structure there is the formation of an SCR parasitic device formed by two transistors, a first of which has the emitter accomplished inside the P type region, the collector accomplished inside the P type insulation pocket and the base accomplished in the N type region, while the second transistor has the collector accomplished in the N region, and thus connected to the base of the first transistor, the base accomplished in the insulation pocket, and thus connected to the collector of the first transistor, and lastly the emitter accomplished in the substrate.

In both techniques for solving the problem during the operation of the circuit the N+ type substrate can go negative with respect to ground. In such a case either the parasitic transistor of the first solution technique or the SCR parasitic of the second solution technique is triggered. If one end of the N+ region connecting the metal tracks is connected to a low impedance power supply unit, the current through the transistor or the SCR are not limited to a practical extent and cause a dissipation of power which damages the connection itself.

If the second solution technique is used a possible protection against parasitic effects may be accomplished by biasing the N region contained in the insulation pocket, through a N+ contact region, at a higher voltage than that attained by the N+ connecting region. In this case the SCR's first parasitic transistor is reverse biased.

If, on the other hand, for circuit reasons, the N+ connection region is also connected to the above higher voltage, and this is also the maximum bias voltage existing in the integrated circuit, the problem arises again triggering the SCR and there is also triggered a further parasitic transistor having the collector accomplished in the N+ contact region, the base accomplished in insulation pocket P and the emitter accomplished in the N+ substrate. There thus occurs the possible damage of the integrated circuit.

The object of the present invention is to create a suitable structure to protect the N+ type crossunder connection regions from possible breakdowns determined by the presence of parasitic transistors.

SUMMARY

According to the invention such object is attained with a device for the protection against breakdown of an N+ type diffused region inserted in a vertical-type semiconductor integrated power structure comprising an N+ type substrate in which there is obtained at least one P+ type insulation pocket connected to ground, which in turn contains an N type region in which there is inserted a P type containment region of said N+ type diffused region, characterized in that said N+ type diffused region is insulated electrically with respect to said P type containment region.

Advantageously it is possible to connect together the N type pockets and the P type containment regions and ground them together with the P type insulation region.

There is also the possibility of separating electrically the N type pockets and P type containment regions from one another and also with respect to the P+ type insulation regions, to thereby leave these regions to have floating voltages with respect to one another.

BRIEF DESCRIPTION OF THE DRAWINGS

The features of the present invention shall be made more evident by the following detailed description of some embodiments illustrated as a non-limiting example in the enclosed drawings, wherein.

DETAILED DESCRIPTION OF THE DRAWINGS

Figure 1:
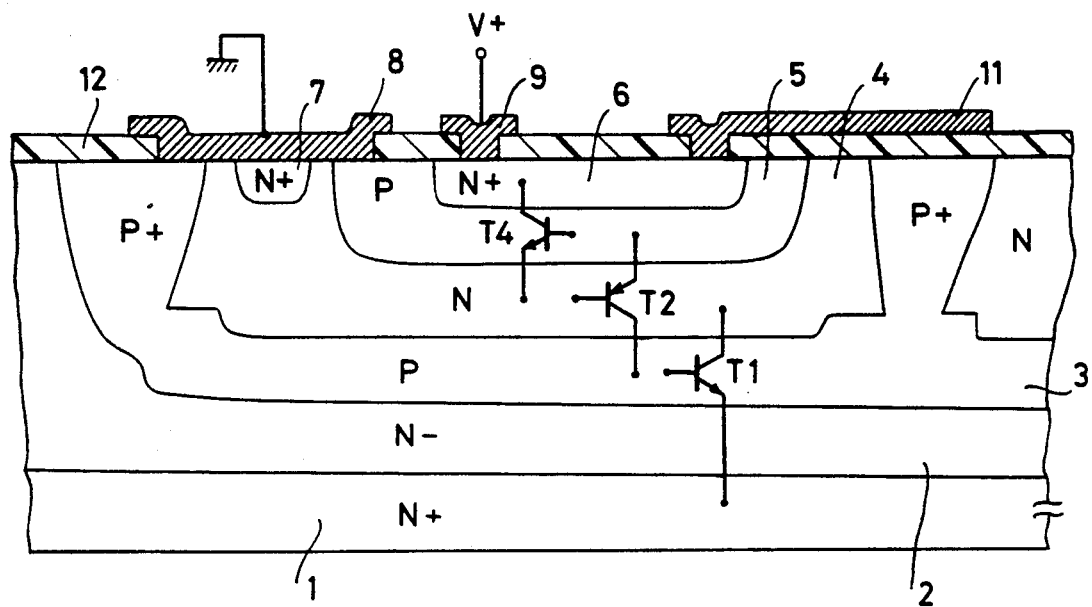
FIG. 1 illustrates a first embodiment in an integrated technology of the device for protection inserted in the integrated structure.

With reference to FIG. 1, over an N+ type substrate, region 1, an N− type epitaxial layer, region 2 is grown. Over this there is implanted and diffused a P type insulation pocket, region 3, provided with P+ type extremities, emerging over the surface of the substrate. Inside pocket 3 a second N type epitaxial layer, region 4, is grown and inside this a P type region 5 is accomplished. An N+ type region 6, suitable for the connection of two metal tracks 9 and 11, is accomplished inside the P type region 5 and at the same time there is accomplished an N+ diffusion, region 7, inside region 4. An oxide layer 12 is deposited over the entire structure.

A metallisation 8 connects together and to ground regions 4, 5 and 7 and the protruding extremities of insulation pocket 3. The metal track 9 is in turn connected to a power supply at a voltage V+.

In the integrated structure there occurs the formation of a parasitic SCR made by transistors T1 and T2. The emitter of transistor T2 is accomplished in the P type region 5, the base is accomplished in the N type region 4 together with the collector of transistor T1 and the collector is accomplished in the P type pocket 3; the base of transistor T1, whose emitter is accomplished in the N+ type substrate 1, is also accomplished at this point.

In the integrated structure of FIG. 1 there also occurs the formation of a further parasitic transistor T4, whose collector is accomplished in region 6, while the base is accomplished in region 5 and thus connected to the emitter of transistor T2 and the emitter is accomplished in region 4 and thus connected to the base of transistor T2.

Figure 2:
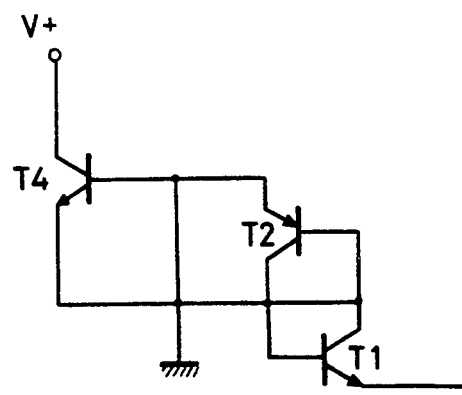
FIG. 2 illustrates the circuit accomplishment of the embodiment illustrated in FIG. 1.

There is thus accomplished the circuit configuration illustrated in FIG. 2, whose transistor T4 is shut out since the base is connected to the emitter; this also holds for transistor T2, which has all junctions grounded. Transistor T1 operates as a diode and is thus subjected to a very low voltage equal to its Vbe. If the substrate, region 1, has a negative voltage amplitude limited to the direct voltage of a diode, transistor T1 is thus not damaged, and clearly transistors T2 or T4 are also not damaged.

Figure 3:
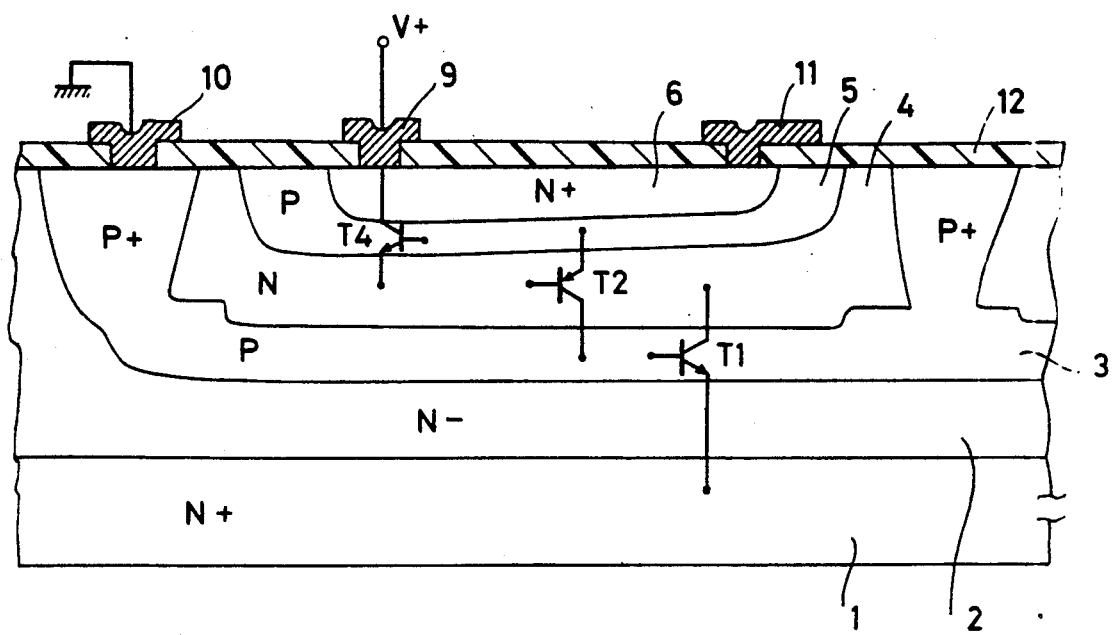
FIG. 3 illustrates a second embodiment in an integrated technology of the device for protection inserted in the integrated structure.

With reference to FIG. 3, the integrated structure illustrated has the same regions as that illustrated in FIG. 1 except for region 7. In addition instead of metallisation 8 there is a metallisation 10 which grounds only pocket 3, while regions 4 and 5 remain insulated from each other and also with respect to both the N+ region 6 and insulation pocket 3. This essentially allows the voltages in these regions, since they are not directly connected electrically with one another, to float with respect to one another.

Figure 4:
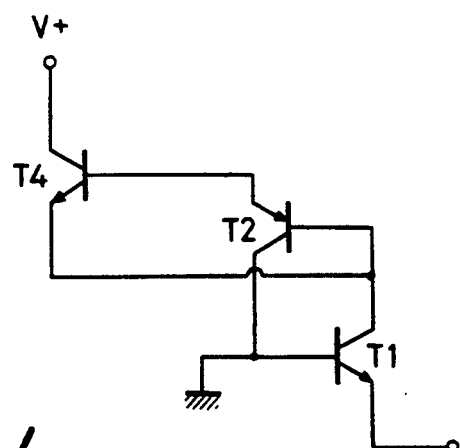
FIG. 4 illustrates the circuit accomplishment of the embodiment illustrated in FIG. 3.

There is thus accomplished the circuit configuration illustrated in FIG. 4. Transistor T4 is off because its base is not supplied with power and thus SCR T1, T2 is off because it has no connection to a current source which should be connected to the emitter of transistor T2. The only junction which goes direct is that of transistor T1, which operates like a diode and for which the same considerations made with reference to FIG. 2 are valid.

We claim:

1. A device for the protection against breakdown of an N+ type diffused crossunder region which is inserted in a semiconductor integrated power structure covered by a superficial insulating layer and is provided with metal contacts passing through said insulating layer for electrical connection of superficial metal tracks, said power structure comprising an N+ type substrate in which there is obtained at least one P+ type insulation pocket, which is provided with metal contact means passing through said insulating layer for electrical connection of said insulation pocket and in turn contains an N type region in which there is inserted a P type containment region, which P type containment region in turn contains a N+ type diffused crossunder region, wherein said N type region and said P type containment region are completely covered by said superficial insulating layer so that they are left electrically floating and not directly electrically connected on one another and to said crossunder region and insulation pocket.

2. A device according to claim 1, characterized in that said insulation pocket is obtained in an N-type epitaxial layer superimposed over the N+ type substrate.

3. A semiconductor integrated power structure comprising an N+ type substrate, at least one P+ type insulation pocket in said substrate, an N type region in said insulation pocket, a P type containment region in said N type region, and N+ type diffused crossunder region contained in said containment region, an insulating layer covering said structure and contact means passing through said insulating layer for electrical connection of said insulation pocket and said crossunder region, wherein said N type region and said containment region are completely covered by said superficial insulating layer so that they are left electrically floating and not directly electrically connected together and to said crossunder region and to said insulating pocket.

4. A structure according to claim 3, wherein said insulation pocket is arranged in an N- type epitaxial layer superimposed on the substrate.

5. A structure, in a semiconductor device, for the protection against breakdown of a N+ diffused region formed beneath, and crossing under, an insulating layer to electrically connect through a low impedance connection, metal tracks formed on, and passing through, the insulating layer, comprising:

an N+ substrate in which there is obtained at least one P+ insulation pocket, the P+ insulation pocket being electrically connected through a low impedance path to a metal track passing through the insulating lager to the P+ insulation pocket;

an N type region contained in the P+ insulation pocket, the N type region in turn containing a P type containment region, the P type containment region containing the N+ diffused region, the insulating layer completely covering, and preventing a low impedance connection between, the N type region and the P containment region, whereby there is an absence of any low impedance electrical connection between the N+ diffused region and the P type containment region, and between the P type containment region and the N type region, and between the N type region and N+ substrate.

* * * * *